(12) United States Patent
Oh

(10) Patent No.: US 7,449,951 B2
(45) Date of Patent: Nov. 11, 2008

(54) LOW VOLTAGE OPERATIONAL AMPLIFIER

(75) Inventor: Tae-Hwan Oh, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 199 days.

(21) Appl. No.: 11/429,772

(22) Filed: May 8, 2006

(65) Prior Publication Data

US 2006/0290427 A1    Dec. 28, 2006

(30) Foreign Application Priority Data

Jun. 27, 2005    (KR)    ....................    10-2005-0055698

(51) Int. Cl.
*H03F 3/30*    (2006.01)
(52) U.S. Cl. ...................... 330/255; 330/262
(58) Field of Classification Search ............ 330/69, 330/301, 252–262
See application file for complete search history.

(56) References Cited

U.S. PATENT DOCUMENTS

| | | | |
|---|---|---|---|
| 5,557,238 A * | 9/1996 | Weiss | 330/258 |
| 6,043,708 A * | 3/2000 | Barr | 330/253 |
| 6,069,532 A * | 5/2000 | Shulman | 330/253 |
| 2005/0007195 A1* | 1/2005 | Schrader | 330/253 |
| 2005/0046480 A1 | 3/2005 | Dyer et al. | |

OTHER PUBLICATIONS

European Patent Application No. 91402659.6 to Carbou, having Publication date of May 20, 1992.
Japanese Patent Application No. 07-105678 to Weiss, having Publication date of Feb. 16, 1996 (w/ English Abstract page).
Japanese Patent Application No. 2002-303140 to Takeshi et al., having Publication date of Jan. 8, 2004 (w/ English Abstract page).
Japanese Patent Application No. 2003-181094 to Naoaki, having Publication date of Jan. 20, 2005 (w/ English Abstract page).

* cited by examiner

*Primary Examiner*—Robert J. Pascal
*Assistant Examiner*—Khiem D Nguyen
(74) *Attorney, Agent, or Firm*—Monica H. Choi

(57) ABSTRACT

An operational amplifier includes a differential amplifier for amplifying differential input signals to generate differential amplified signals. The operational amplifier also includes first and second single-ended amplifiers that each amplify the differential amplified signals to respectively generate first and second single-ended output signals that are differential with respect to each-other.

20 Claims, 15 Drawing Sheets

410

LOW VOLTAGE OPERATIONAL AMPLIFIER

BACKGROUND OF THE INVENTION

This application claims priority to Korean Patent Application No. 2005-55698, filed on Jun. 27, 2005 in the Korean Intellectual Property Office, the disclosure of which is incorporated herein in its entirety by reference.

1. Field of the Invention

The present invention relates generally to operational amplifiers, and more particularly, to an operational amplifier having a pseudo-differential output stage for operating with low voltage.

2. Description of the Related Art

With advancement of fabrication technology, integrated circuits with reduced line widths operate with lower voltages. For example, an integrated circuit with a line width of about 90 nm operates with a voltage of about 1 volt. However, the integrated circuit may not operate properly with such a low voltage, especially when the integrate circuit is comprised of field effect transistors that should operate in saturation.

FIG. 1 is a block diagram of a conventional two-stage operational amplifier with multiple stages for obtaining a high DC gain. For obtaining the high DC gain, a folded-cascode amplifier A1 is used as a first stage, and for obtaining a wide output range, a common source amplifier A2 is used as a second stage.

In the prior art operational amplifier of FIG. 1, the two stages A1 and A2 each are differential amplifiers. FIG. 2 is a circuit diagram of such a folded-cascode amplifier A1 and such a common source amplifier A2 of FIG. 1. The folded-cascode amplifier A1 comprises differential input NMOSFETs (N-channel metal oxide semiconductor field effect transistors) M1 and M2 with a biasing NMOSFET M3 having a bias BS1 applied thereon.

In addition, the folded-cascode amplifier A1 includes a cascode load comprised of NMOSFETs M5, M6, M7, M8, M9, M10, M11, and M12 having biases BS2, BS3, BS4, and CMFB1 applied thereon. The bias CMFB1 is a common-mode feed-back bias that determines a common-mode voltage level of the first and second amplified signals OUT+ and OUT−. A feed-back circuit (not shown in FIG. 2) is used for controlling the common-mode voltage of the first and second amplified signals OUT+ and OUT− with the common-mode feed-back bias CMFB1.

The gates of the NMOSFETs M1 and M2 have differential input signals IN+ and IN− applied thereon. The folded-cascode amplifier A1 generates a first amplified signal OUT− at the drains of M8 and M10 and generates a second amplified signal OUT+ at the drains of M7 and M9. The difference of OUT+ and OUT− is an amplification of a difference between IN+ and IN−.

The common source amplifier A2 includes differential input field effect transistors M15 and M16 having gates with the first and second amplified signals OUT+ and OUT− respectively applied thereon. Field effect transistors M13 and M14 form loads for the differential input field effect transistors M15 and M16. A first re-amplified signal is formed at the drains of M14 and M16, and a second re-amplified signal is formed at the drains of M13 and M15. The difference between such first and second re-amplified signals generated by the common source amplifier A2 is an amplification of the difference between the first and second amplified signals from the folded-cascode amplifier A1.

The common source amplifier A2 also includes a biasing field effect transistor M17 having a bias CMFB2 applied thereon. The bias CMFB2 is a common-mode feed-back bias that determines a common-mode voltage level of the first and second re-amplified signals generated by the common source amplifier A2. A feed-back circuit (not shown in FIG. 2) is used for controlling the common-mode voltage level of such first and second re-amplified signals with the common-mode feed-back bias CMFB2.

For proper operation of the operational amplifier in FIG. 2, all of the transistors should operate in saturation with the following Expression 1 being satisfied:

$Vdd-Vss > 4*V\_DSsat + V\_th$  [Expression 1]

Vdd is the voltage of a high power source, and Vss is the voltage of a low power source. V_DSsat is a minimum drain-to-source voltage for operating a transistor in saturation. V_th is a threshold voltage of a transistor.

When the operational amplifier has a line width of about 90 nm, Vdd−Vss is about 1.0 volt. However, 4*V_DSsat +V_th may be larger than 1.0 volt. For example, V_th may be about 0.3 volts, and V_DSsat may be about 0.2 volts such that 4*V_DSsat +V_th is about 1.1 volts.

An output common-mode voltage level of the first stage A1 should be equal to that of an input common-mode voltage level of the second stage A2. For example, when the output common-mode voltage of the first stage A1 is set at about a half of Vdd−Vss (0.5 volts), a minimum of 2*V_DSsat +V_th that is desired for the input common-mode voltage level of the second stage A2 is 0.5 volts. Due to a body effect in the input transistors M15 and M16, the threshold voltage V—th for M15 and M16 is increased to about 0.4 volts such that M17 cannot reach saturation.

For preventing such a problem, the input common-mode voltage level of the second stage A2 may be set higher to 0.5 volts. However, the output common-mode voltage of the first stage A1 is then increased such that a voltage margin for operating the output transistors M7 and M8 in saturation is decreased. When Vdd−Vss is about 0.9 volts, such transistors M7 and M8 cannot reach saturation.

When the transistors in the operational amplifier of FIG. 2 are not in saturation, the DC gain is decreased or the transconductance varies. In that case, the operational amplifier may not satisfy performance requirements.

FIG. 3A shows a simulation graph of transient responses of the conventional operational amplifier when the power voltage Vdd−Vss is at 1.0 volt or 0.9 volts. Referring to FIG. 3A, the operational amplifier settles to a lower voltage level for the lower power voltage. FIG. 3B is a partially enlarged view of a portion of FIG. 3A. Referring to FIG. 3B, when the power voltage Vdd−Vss is 1.0 volt, a settling time of the output voltage of the operational amplifier is 1.5 ns (nano-seconds), and when the power voltage decreases to 0.9 volts, the settling time of the operational amplifier is increased to 2.7 ns. Thus, the performance of the conventional operational amplifier is degraded when the power voltage is lower.

Thus, an operational amplifier with the field effect transistors operating in saturation even with variation of the power voltage is desired.

SUMMARY OF THE INVENTION

Accordingly, an operational amplifier uses single-ended amplifiers for a pseudo-differential second stage thus ensuring that the field effect transistors operate in saturation.

An operational amplifier includes a differential amplifier for amplifying differential input signals to generate differential amplified signals. In addition, the operational amplifier includes first and second single-ended amplifiers that each amplify the differential amplified signals to respectively generate first and second single-ended output signals that are differential with respect to each-other.

In an example embodiment of the present invention, the first and second single-ended amplifiers do not have any common mode feed-back bias applied thereon. With use of such single-ended amplifiers at the pseudo-differential second stage, a common mode feed-back bias is not used for biasing. Thus, the second stage has fewer transistors disposed between the power supplies for ensuring that the transistors of the operational amplifier operate in saturation.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale.

DETAILED DESCRIPTION OF THE INVENTION

Figure 4:
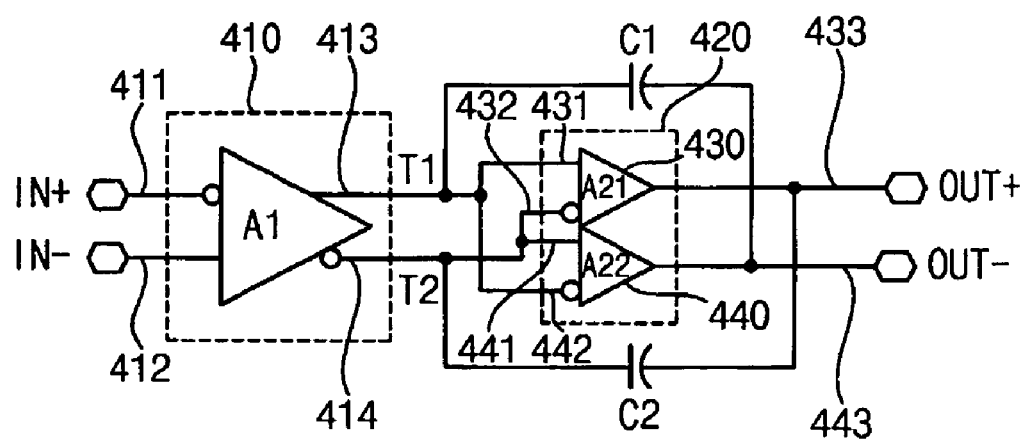
FIG. 4 is a block diagram of an operational amplifier according to an example embodiment of the present invention.

FIG. 4 is a block diagram of an operational amplifier according to an example embodiment of the present invention. Such an operational amplifier has multiple stages including a differential amplifier stage 410 and an output amplifier stage 420, for attaining high gain.

The differential amplifier stage 410 is implemented with a differential amplifier that rejects common-mode noise. The differential amplifier stage 410 includes a pair of input terminals 411 and 412 having differential inputs IN+ and IN− applied thereon. The differential amplifier stage 410 also includes a pair of output terminals 413 and 414 that generate first and second differential amplified signals T1 and T2 thereon.

The output amplifier stage 420 is implemented using a pseudo-differential amplifier including a pair of single-ended amplifiers 430 and 440. A first single-ended amplifier 430 receives the first and second differential amplified signals from the differential amplifier stage 410 through input terminals 431 and 432 for further amplifying a difference between such signals to generate a first single-ended output signal at a first output terminal 433. A second single-ended amplifier 440 receives the first and second differential amplified signals from the differential amplifier stage 410 through input terminals 441 and 442 for further amplifying a difference between such signals to generate a second single-ended output signal at a second output terminal 443.

The operational amplifier of FIG. 4 also includes a first capacitor C1 and a second capacitor C2. The first capacitor C1 is coupled between the second output terminal 443 of the second single-ended amplifier 440 and the inputs terminals 431 and 442 of the first and second single-ended amplifiers 430 and 440. The second capacitor C2 is coupled between the first output terminal 433 of the first single-ended amplifier 430 and the inputs terminals 432 and 441 of the first and second single-ended amplifiers 430 and 440. Such capacitors C1 and C2 improve stability of the operational amplifier according to the miller effect.

Figure 5A:
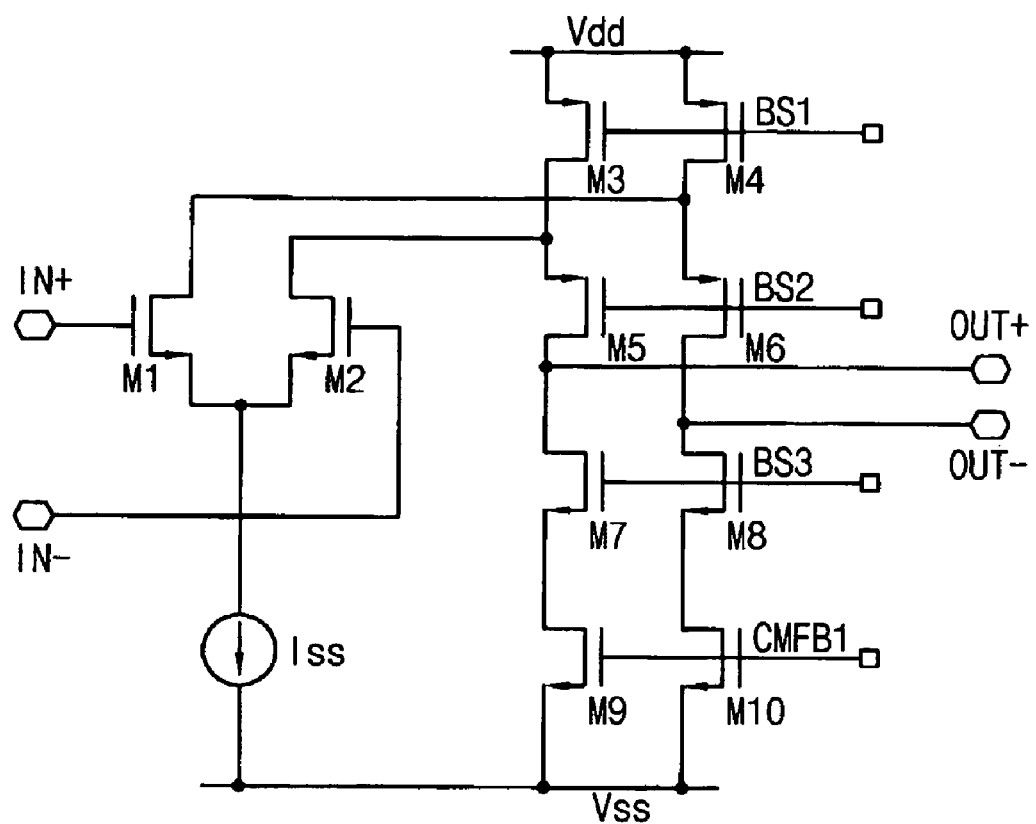
FIGS. 5A, 5B, 5C, and 5D are circuit diagrams of a differential amplifier in FIG. 4 according to various example embodiments of the present invention.

FIG. 5A is a circuit diagram of a differential amplifier for the differential amplifier stage 410 in FIG. 4 according to an example embodiment of the present invention. The differential amplifier in FIG. 5A is a folded-cascode amplifier in an example embodiment of the present invention.

Referring to FIG. 5A, the differential amplifier includes differentially coupled input field effect transistors M1 and M2. The sources of the transistors M1 and M2 are coupled to a current source Iss which may be implemented using an NMOS transistor. The gates of the transistors M1 and M2 have differential input signals IN+ and IN− respectively applied thereon.

The differential amplifier further comprises a cascode load comprised of field effect transistors M3, M4, M5, M6, M7, M8, M9, and M10. With such a cascode load, the output impedance is increased for in turn increasing the DC gain of the differential amplifier of FIG. 5A.

The cascode load is comprised of a respective two stacked transistors coupled between one of the differential output nodes OUT+ and OUT− and one of the power supplies Vdd and Vss. M3 and M5 form such a stack coupled between OUT+ and Vdd; M4 and M6 form such a stack coupled between OUT− and Vdd; M7 and M9 form such a stack coupled between OUT+ and Vss; and M8 and M10 form such a stack coupled between OUT− and Vss. The drains of M1 and M2 are coupled to the drains of M4 and M3, respectively.

The gates of M3 and M4 have a bias BS1 applied thereon; the gates of M5 and M6 have a bias BS2 applied thereon; the gates of M7 and M8 have a bias BS3 applied thereon; and the gates of M9 and M10 have a bias CMFB1 applied thereon. The bias CMFB1 is a common-mode feed-back bias that determines a common-mode voltage level of first and second differential amplified signals generated at the output nodes OUT+ and OUT−, respectively. (Note that such first and second differential amplified signals are also designated as OUT+ and OUT− hereafter.) A feed-back circuit (not shown in FIG. 5A) is used for controlling the common-mode voltage level of the first and second differential amplified signals OUT+ and OUT− with the common-mode feed-back bias CMFB1.

Figure 5B:
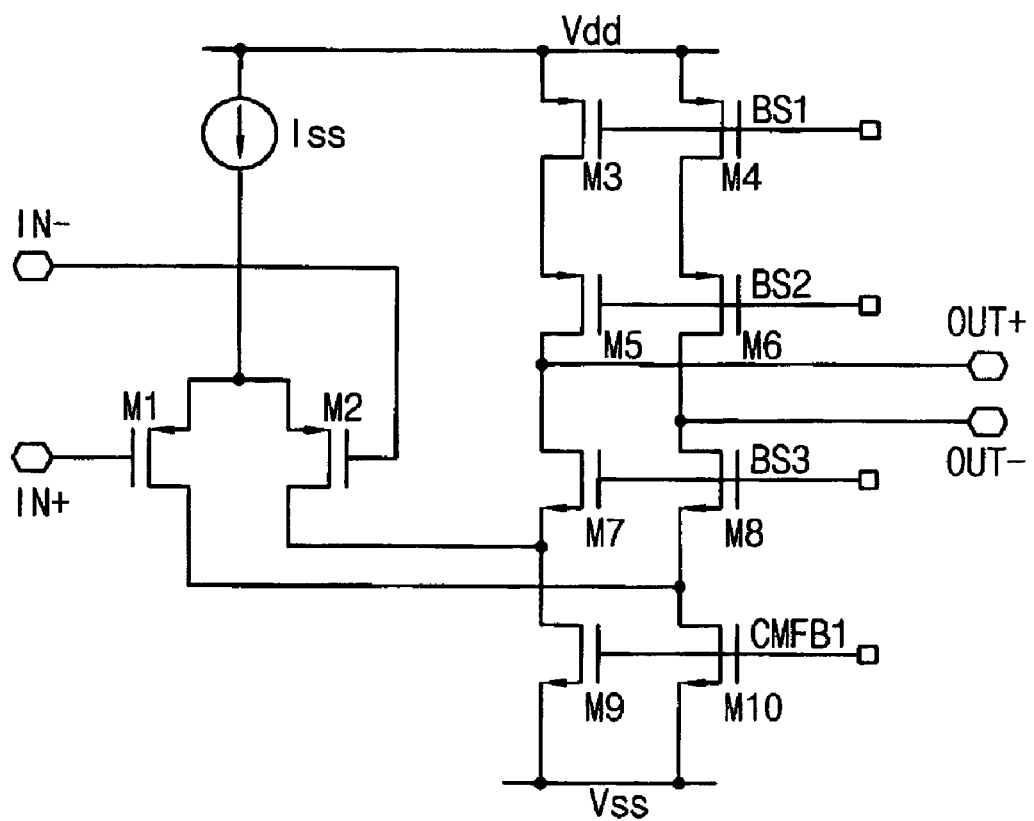

FIG. 5B is a circuit diagram of the differential amplifier in the stage 410 of FIG. 4 according to another example embodiment of the present invention. FIGS. 5A and 5B are similar, but the differentially coupled input transistors M1 and M2 are NMOSFETs (N-channel metal oxide field effect transistors) in FIG. 5A and are PMOSFETs (P-channel metal oxide field effect transistors) in FIG. 5B. Thus, the drains of M1 and M2 are coupled to the drains of M10 and M9, respectively in FIG. 5B, and the current source ISS may be implemented using a PMOS transistor.

In addition, the common-mode voltage levels are different for the differential amplifiers in FIGS. 5A and 5B. One of the differential amplifiers FIG. 5A and in FIG. 5B may be selected depending on the common mode voltage level requirement for the operational amplifier.

Figure 5C:
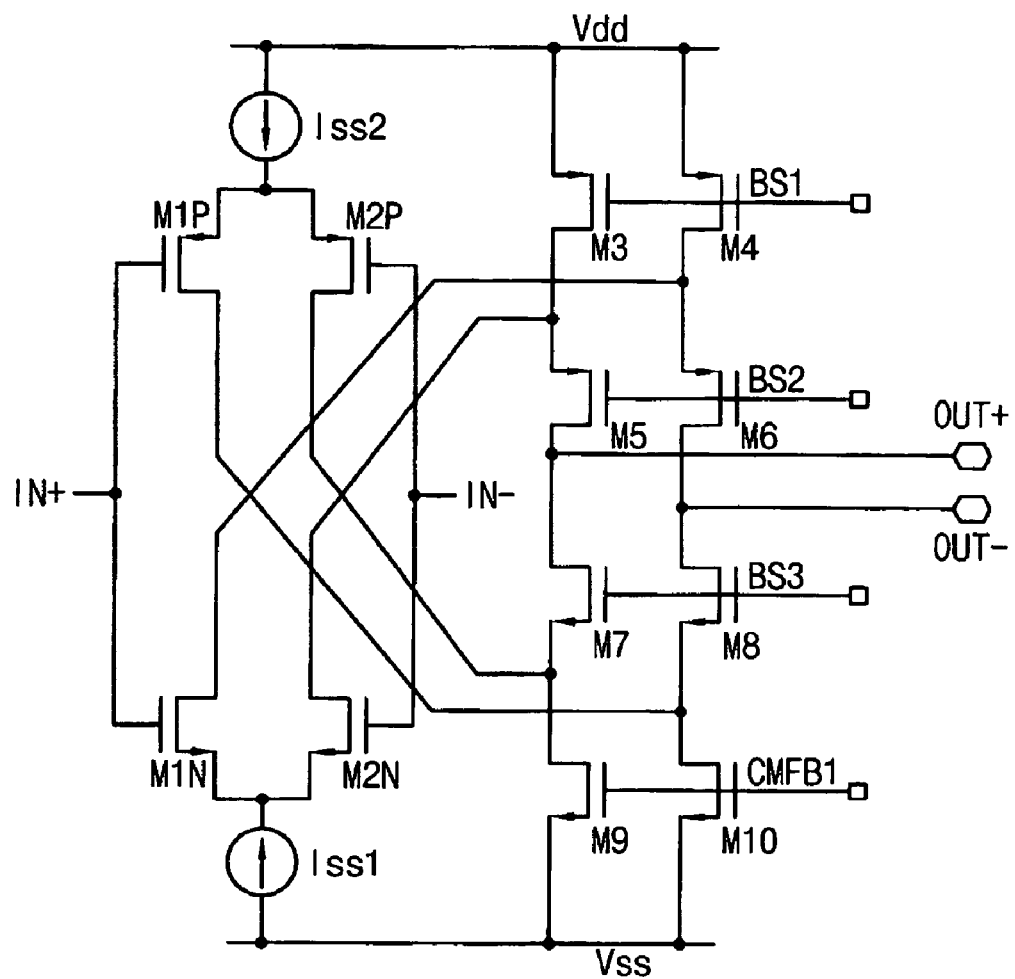

FIG. 5C is a circuit diagram of the differential amplifier in the differential amplifier stage 410 of FIG. 4 according to another example embodiment of the present invention. The differential amplifier in FIG. 5C has a pair of differentially coupled PMOSFETs M1P and M2P and a pair of differentially coupled NMOSFETs M1N and M2N. The gates of M1P and M1N are coupled together to receive one IN+ of the differential input signals, and the gates of M2P and M2N are coupled together to receive another one IN− of the different input signals.

Current sources Iss1 and Iss2 bias such transistors M1P, M2P, M1N, and M2N. The drains of M1P and M2P are coupled to the drains of M10 and M9, respectively, of the cascode load. The drains of M1N and M2N are coupled to the drains of M4 and M3, respectively, of the cascode load. Use of both the PMOSFETs M1P and M2P and the NMOSFETs M1N and M2N in FIG. 5C allows for a wider range of the input common-mode level than in FIGS. 5A and 5B.

Figure 5D:
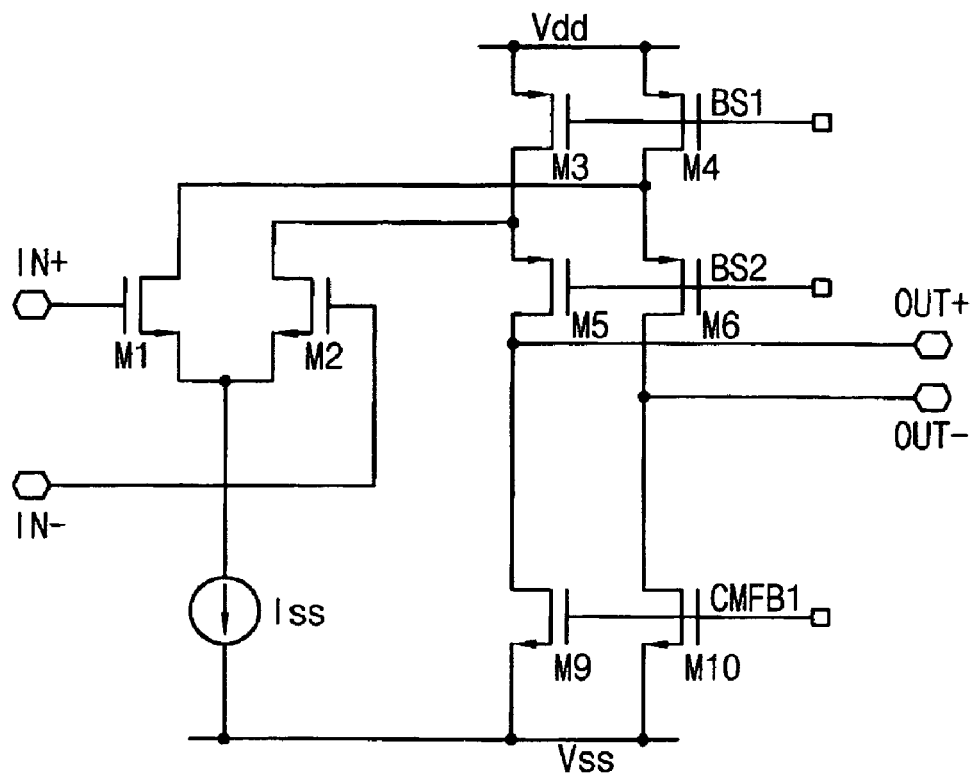

FIG. 5D is a circuit diagram of the differential amplifier in the differential amplifier stage 410 of FIG. 4 according to another example embodiment of the present invention. The differential amplifier of FIG. 5D is especially advantageous when the power voltage Vdd−Vss is relatively low. FIGS. 5A and 5D are similar except that M7 and M8 of FIG. 5A are not present in FIG. 5D. As a result, the differential amplifier of FIG. 5D has reduced output impedance and gain from that in FIG. 5A, but may operate with lower power voltage Vdd−Vss.

Figure 6A:
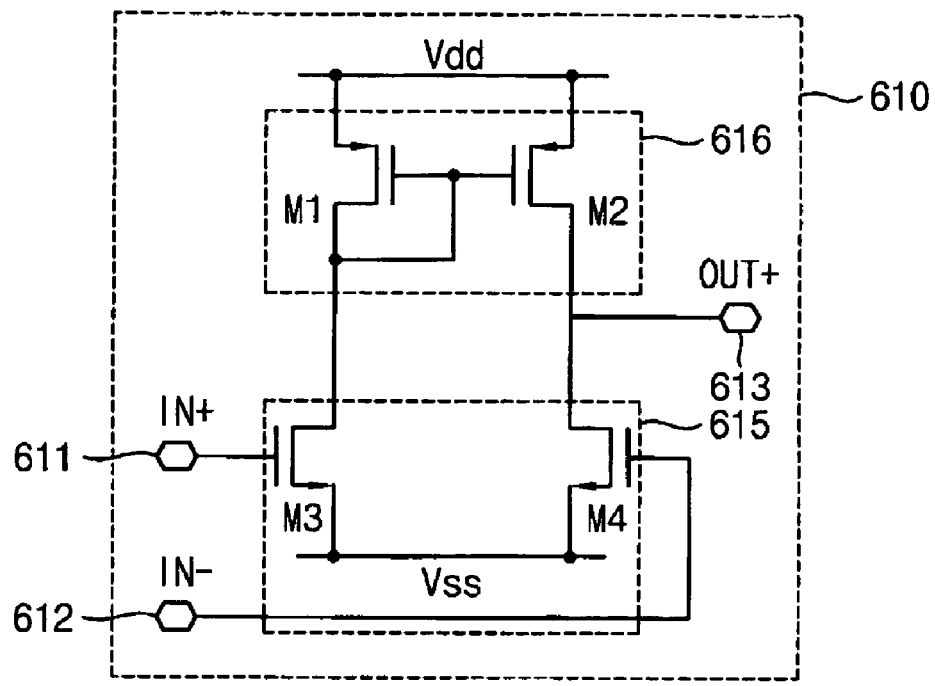
FIGS. 6A and 6B are circuit diagrams of single-ended amplifiers in FIG. 4 according to various embodiments of the present invention.
Figure 6A:
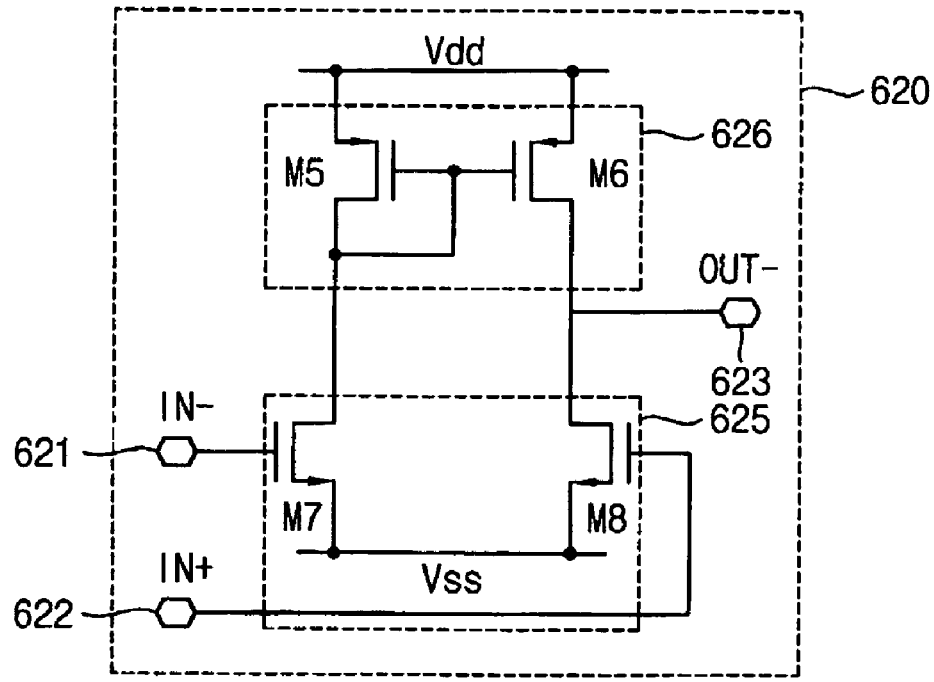

FIG. 6A is a circuit diagram of the output amplifier stage 420 in FIG. 4 according to an example embodiment of the present invention. Referring to FIG. 6A, the output amplifier stage 420 of FIG. 4 includes a first single-ended amplifier 610 (for 430 in FIG. 4) and a second single-ended amplifier 620 (for 440 in FIG. 4). In the example embodiment of FIG. 6A, the first and second single-ended amplifiers 610 and 620 have a same circuit topology.

The first single-ended amplifier 610 receives the first and second differential amplified signals generated from the differential amplifier stage 410 through two input terminals 611 and 612, respectively. The first single-ended amplifier 610 amplifies a difference between such input signals to generate a first single-ended output signal (designated OUT+ in FIG. 6A) at an output terminal 613.

The second single-ended amplifier 620 also receives the first and second differential amplified signals generated from the differential amplifier stage 410 through two input terminals 622 and 621, respectively. The second single-ended amplifier 620 amplifies a difference between such input signals to generate a second single-ended output signal (designated OUT+ in FIG. 6A) at another output terminal 623.

The first and second single-ended output signals OUT+ and OUT− are differential with respect to each-other. Thus, when one of the first and second single-ended output signals OUT+ and OUT− increases, the other one decreases, and vice versa.

The first single-ended amplifier 610 includes a pair 615 of differentially coupled field effect transistors M3 and M4. The gates of such transistors M3 and M4 form the input terminals 611 and 612, respectively. The sources of such transistors M3 and M4 are coupled together to the low power supply Vss.

The first single-ended amplifier 610 also includes a current-mirror load 616 comprising a diode-connected field effect transistor M1 and a non-diode-connected field effect transistor M2. The drains of M1 and M3 are coupled together, and the drains of M2 and M4 are coupled together at the output node 613.

Similarly, the second single-ended amplifier 620 includes a pair 625 of differentially coupled field effect transistors M7 and M8. The gates of such transistors M7 and M8 form the input terminals 621 and 622, respectively. The sources of such transistors M7 and M8 are coupled together to the low power supply Vss.

The second single-ended amplifier 620 also includes a current-mirror load 626 comprising a diode-connected field effect transistor M5 and a non-diode-connected field effect transistor M6. The drains of M5 and M7 are coupled together, and the drains of M6 and M8 are coupled together at the other output node 623.

Figure 6B:
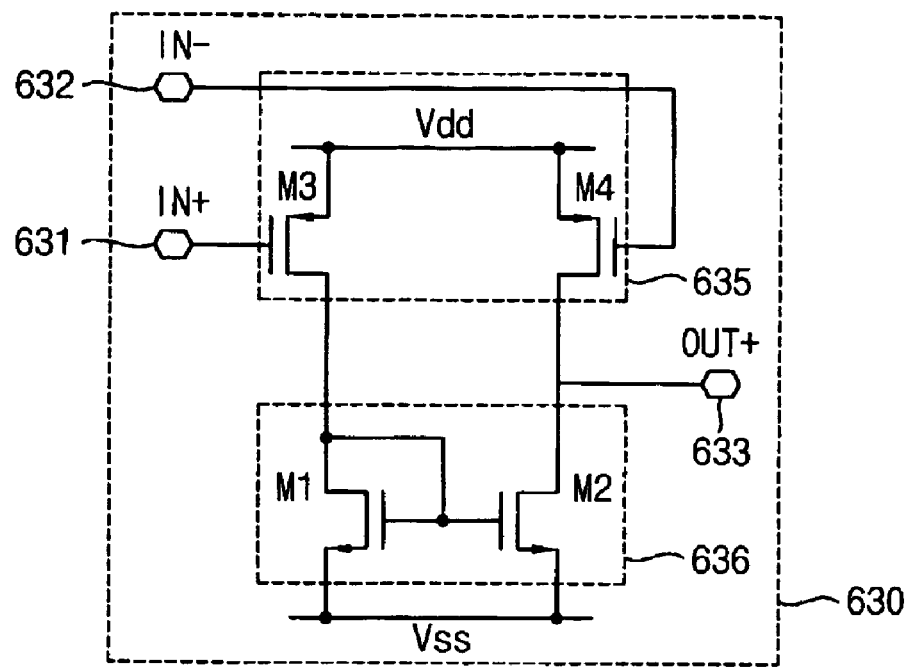
Figure 6B:
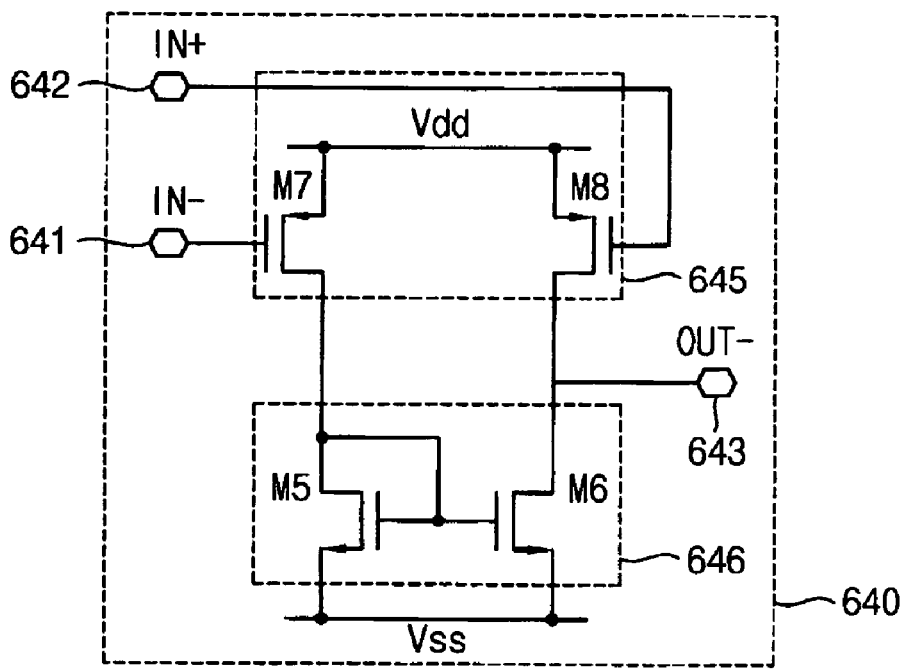

FIG. 6B shows an alternative embodiment for the output amplifier stage 420 of FIG. 4 with a first single-ended amplifier 630 (for 430 in FIG. 4) and a second single-ended amplifier 640 (for 440 in FIG. 4). The output amplifier stage 420 may be implemented as in FIG. 6A or 6B depending on the common-mode voltage level of the differential amplified signals from the differential amplifier stage 410.

Comparing FIGS. 6A and 6B for the first single-ended amplifier 630, a pair 635 of the differentially coupled transistors M3 and M4 for receiving the differentially amplified signals at input terminals 631 and 632 are PMOSFETs (P-channel metal oxide field effect transistors) in FIG. 6B instead of NMOSFETs (N-channel metal oxide field effect transistors). Also, the current mirror load 636 in FIG. 6B is formed by the NMOSFETs M1 and M2 in FIG. 6B instead of PMOSFETs.

Similarly for the second single-ended amplifier 640, a pair 645 of the differentially coupled transistors M7 and M8 for receiving the differentially amplified signals at input terminals 641 and 642 are PMOSFETs in FIG. 6B instead of NMOSFETs. Also, the current mirror load 646 in FIG. 6B are formed by the NMOSFETs M5 and M6 in FIG. 6B instead of PMOSFETs.

Figure 7:
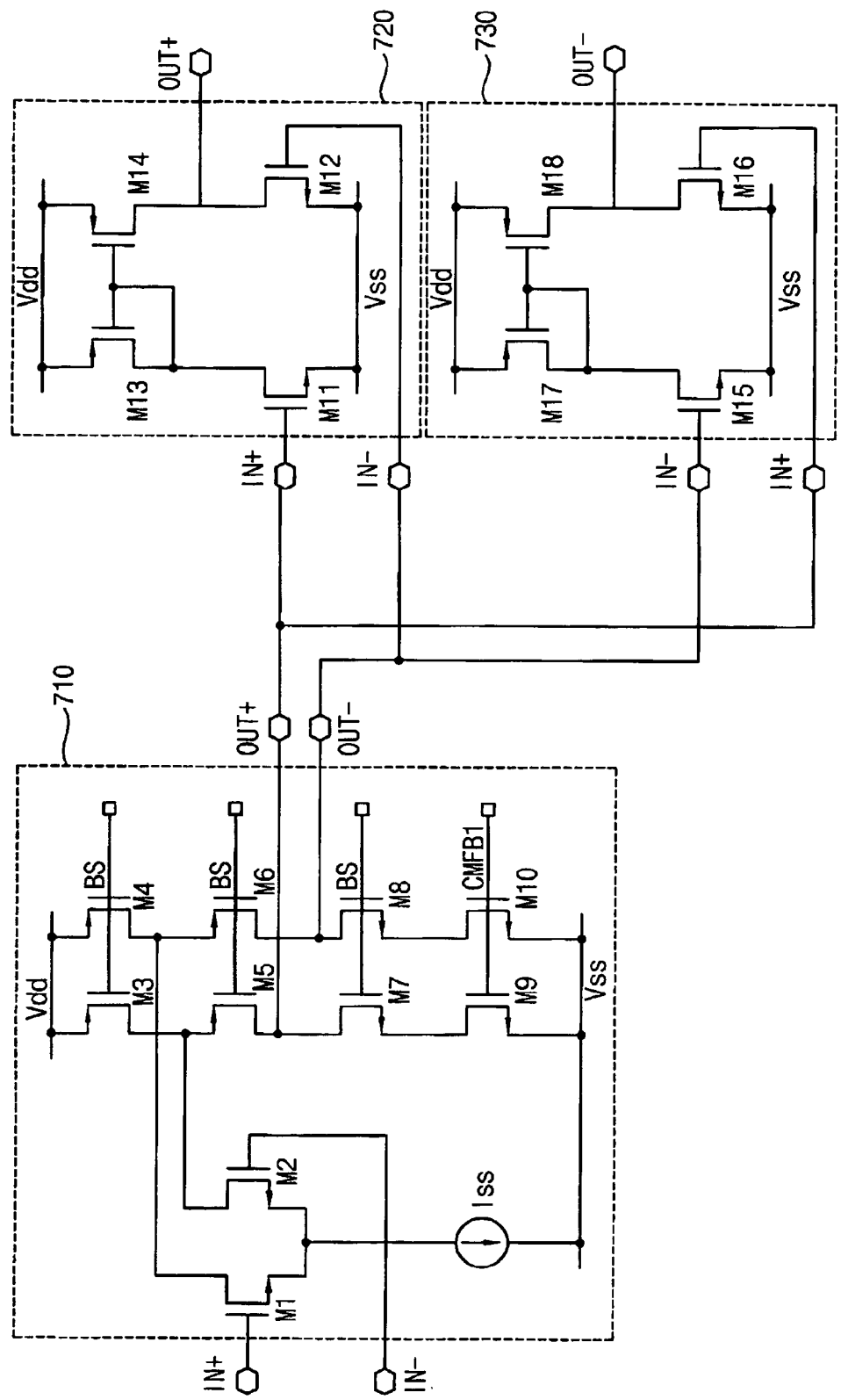
FIG. 7 is a circuit diagram of an operational amplifier according to an example embodiment of the present invention.

FIG. 7 shows an operational amplifier including a differential amplifier stage 710 with the differential amplifier of FIG. 5A, a first single-ended amplifier 720 substantially identical with 610 of FIG. 6A, and a second single-ended amplifier 730 substantially identical with 620 of FIG. 6A.

For proper operation of the operational amplifier of FIG. 7, all field effect transistors should operate in saturation with the following Expression 2 being satisfied:

$$\text{Vdd} - \text{Vss} > 3 * V\_\text{DSsat} + V\_\text{th} \qquad \text{[Expression 2]}$$

Vdd is the voltage of a high power source, and Vss is the voltage of a low power source. V_DSsat is a minimum drain-to-source voltage for operating a transistor in saturation. V_th is a threshold voltage of a transistor.

Figure 1:
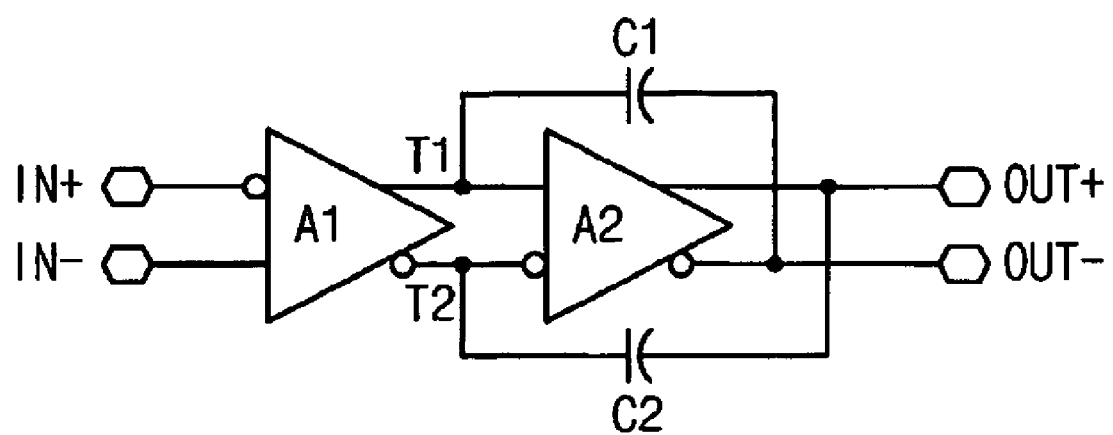
FIG. 1 is a block diagram of a conventional two-stage operational amplifier.
Figure 2:
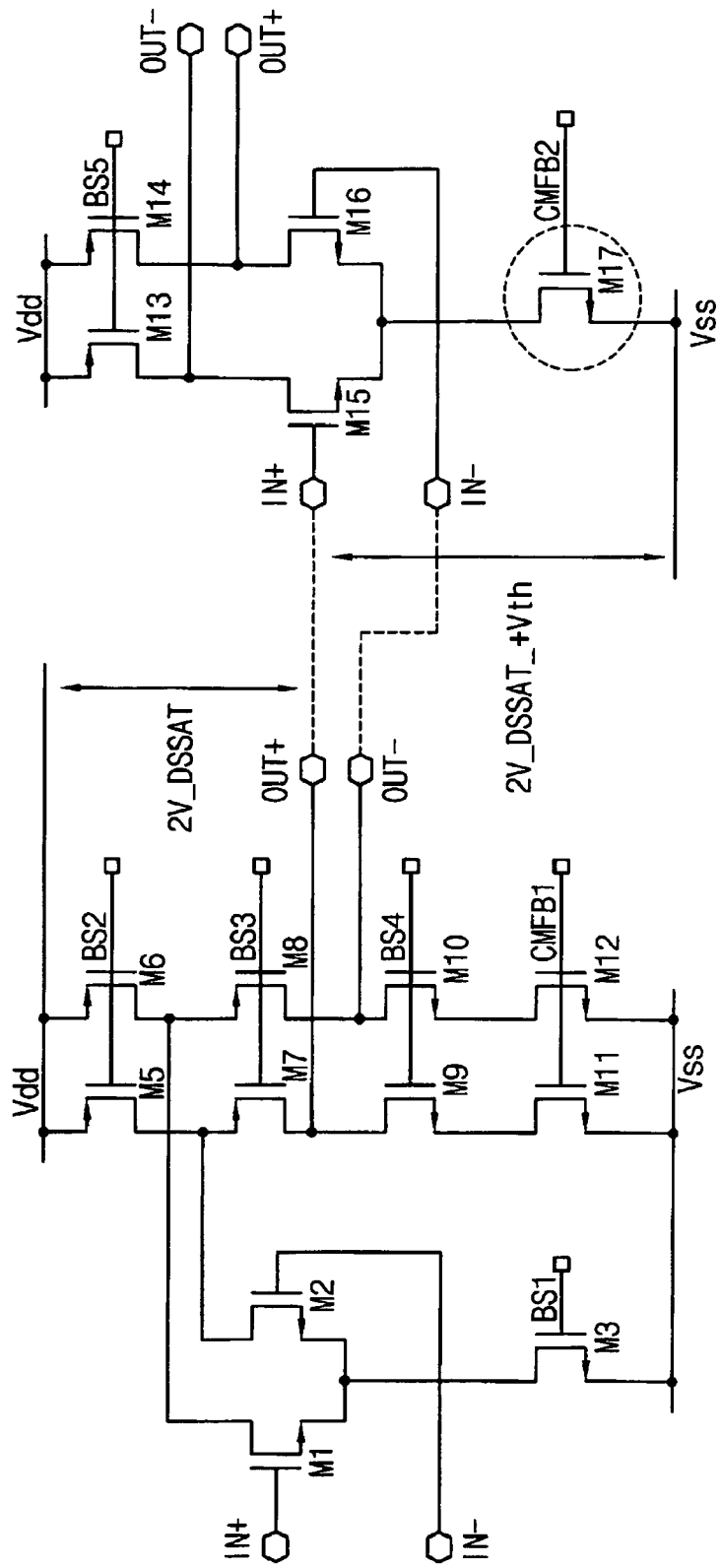
FIG. 2 is a circuit diagram of the conventional two-stage operational amplifier.

Thus, the operational amplifier of FIG. 7 has a power voltage margin larger than that of the conventional operational amplifier of FIG. 2, by as much as V_DSsat. Such a larger margin results because the operational amplifier of FIG. 7 does not include the transistor M17 of FIG. 2 with the common-mode feedback bias.

That is, the pseudo-differential output amplifier stage 420 for the operational amplifier of FIG. 7 is implemented using two single-ended amplifiers 720 and 730 such that common-mode feedback control is not used. Rather, the operational amplifier according to an example embodiment of the present invention operates with lower power voltage levels by employing the pseudo-differential output amplifier stage 420.

Figure 8A:
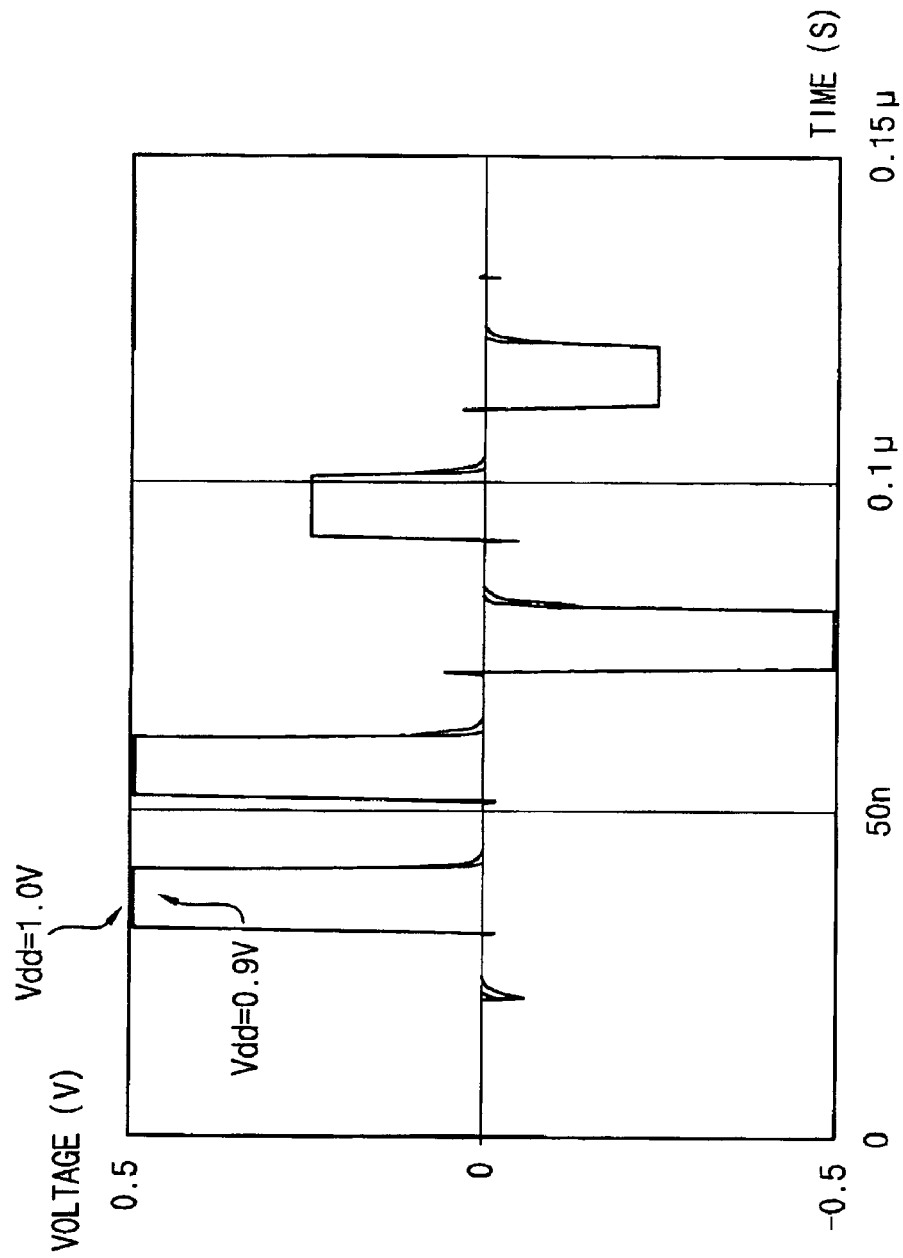
FIGS. 8A and 8B are simulation graphs of transient responses of an operational amplifier according to an example embodiment of the present invention.
Figure 8B:
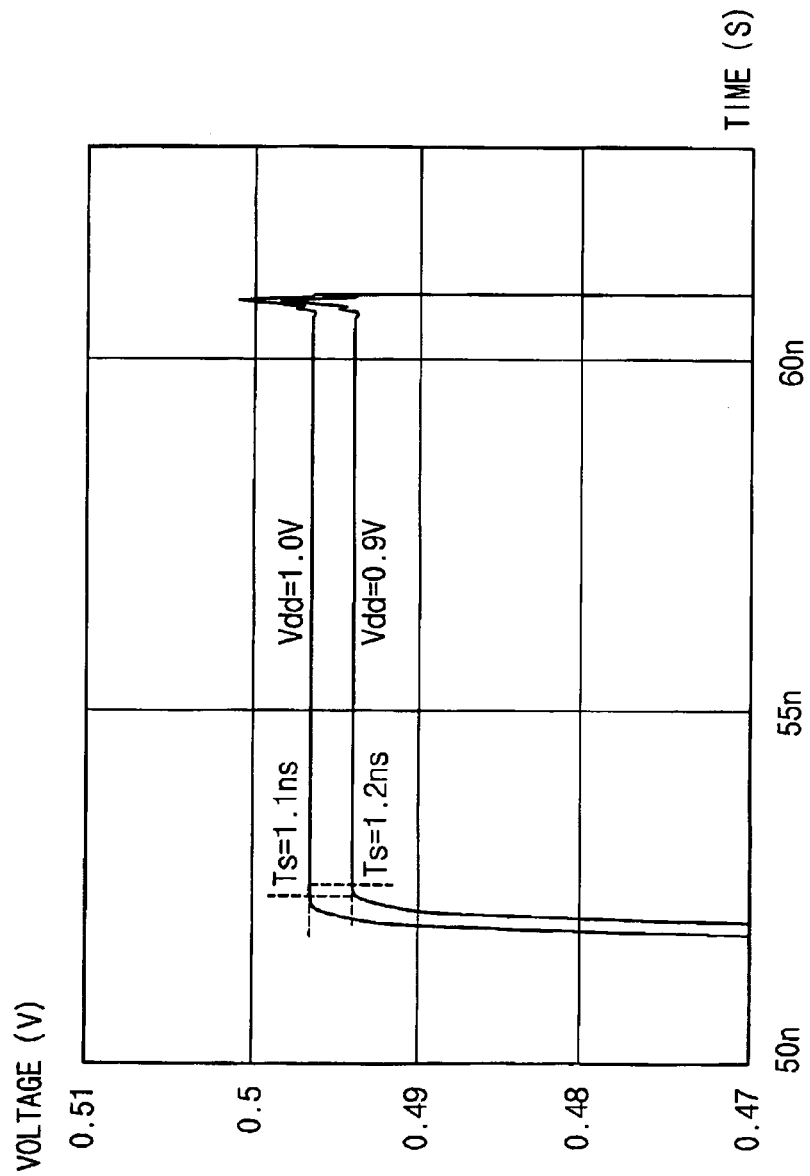

FIGS. 8A and 8B are simulation graphs of transient responses for an operational amplifier according to an example embodiment of the present invention, such as the operational amplifier of FIG. 7. When the power supply voltage Vdd–Vss is about 1 volt, such an operational amplifier has a settling time of about 1.1 ns (nano-seconds), shorter than the settling time of about 1.5 ns for a conventional operational amplifier.

When the power supply voltage Vdd–Vss is about 0.9 volts, the operational amplifier of FIG. 7 has the settling time of about 1.2 ns, much shorter than the settling time of about 2.7 ns for the conventional operational amplifier. The conventional operational amplifier has a longer settling time because some transistors therein do not operate in saturation for the lower power supply voltage. In contrast, all of the transistors in the operational amplifier according to an example embodiment of the present invention operate in saturation for the lower power supply voltage.

Figure 3A:
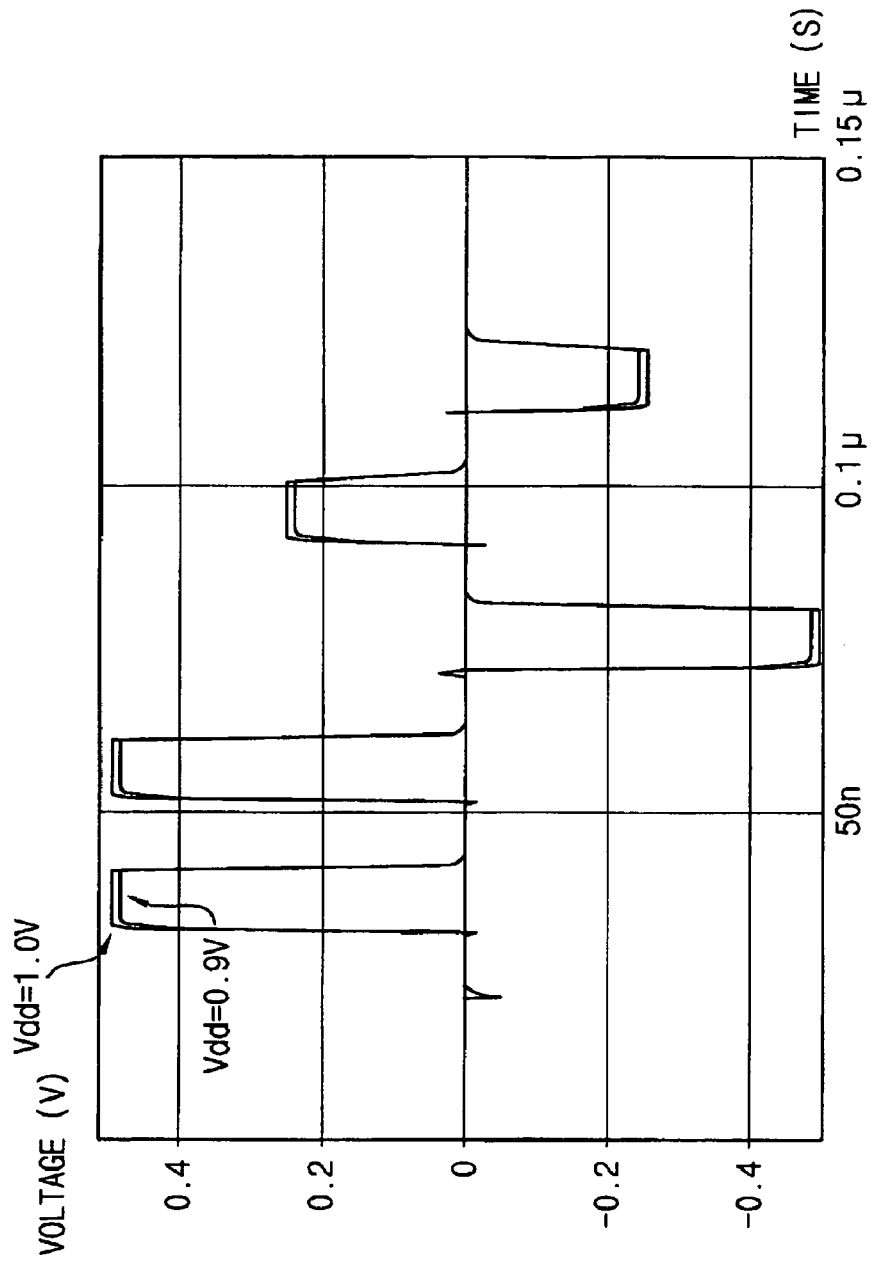
FIGS. 3A and 3B are simulation graphs of transient responses of the conventional two-stage operational amplifier.
Figure 3B:
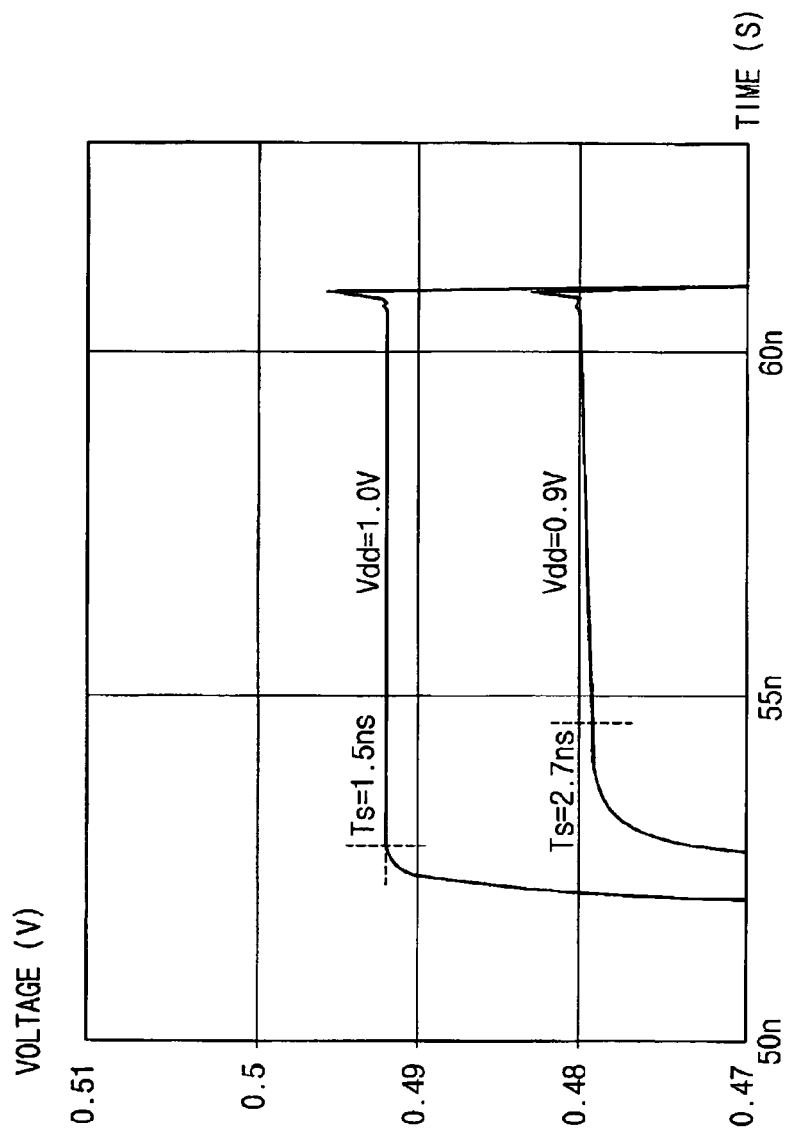

Further, when the power supply voltage Vdd–Vss is 1 volt or 0.9 volts, the operational amplifier according to an example embodiment of the present invention may generate an output voltage that is greater than about 0.49 volts to approximately 0.5 volts. In contrast, referring to FIG. 3A, the output voltage generated by the conventional operational amplifier approaches only about 0.48 volts when the power supply voltage Vdd–Vss is 0.9 volts, and approaches only about 0.49 volts when the power supply voltage Vdd–Vss is 1 volt.

Figure 9:
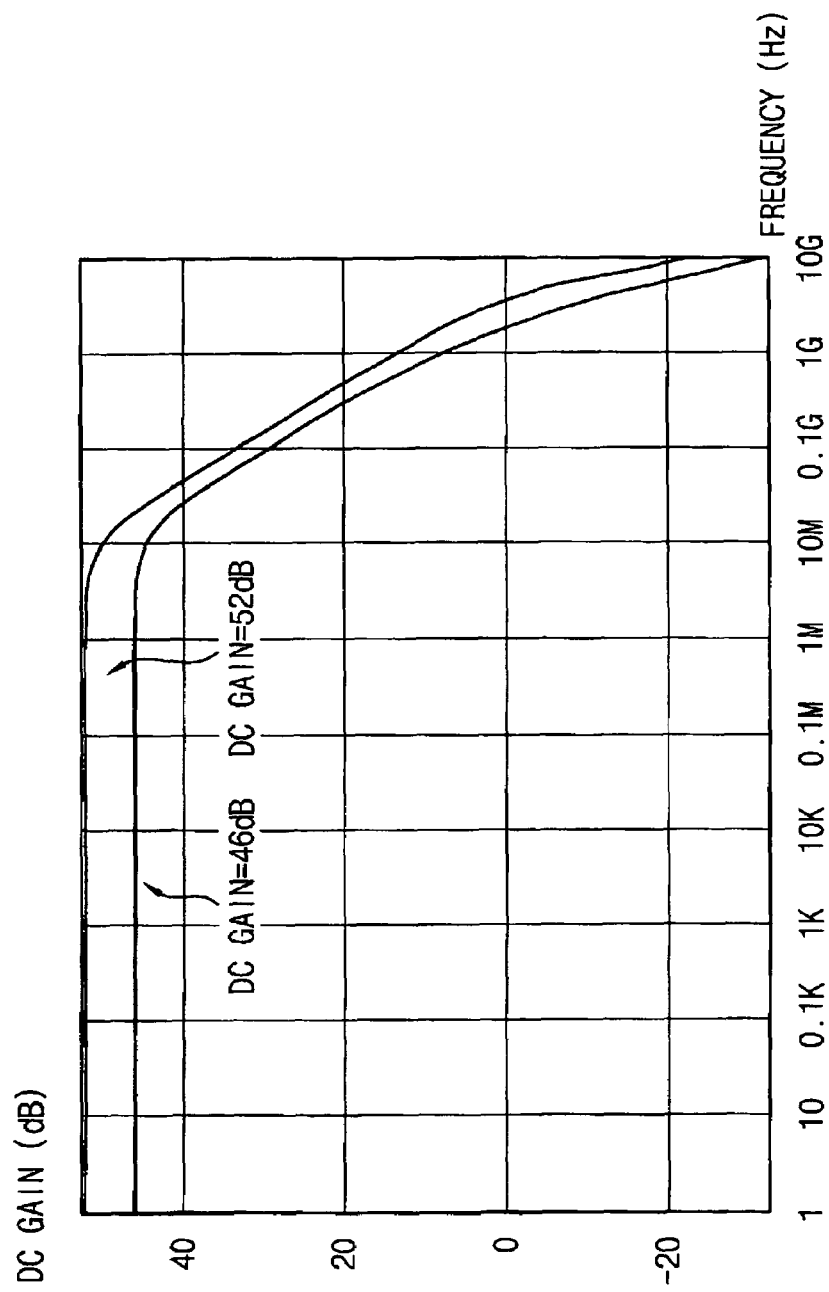
FIG. 9 is a graph of DC gain vs. frequency for comparing performance of a conventional operational amplifier and an operational amplifier according to an example embodiment of the present invention.

FIG. 9 is a plot comparing frequency responses for the conventional operational amplifier and the operational amplifier according to an example embodiment of the present invention. In FIG. 9, the higher plot is for the frequency response of the operational amplifier according to an example embodiment of the present invention which is greater than that of the conventional operational amplifier by as much as 6dB at the DC level and generally greater than that of the conventional operational amplifier in all of the frequency ranges.

In addition, because a load capacitance of the second stage 420 may be smaller for the operational amplifier according to example embodiments of the present invention, such an operational amplifier may operate with high speed at lower power supply voltage. In addition, the first stage 410 of the operational amplifier according to an example embodiment of the present invention includes the differential amplifier for rejecting common-mode noise.

While the example embodiments of the present invention and their advantages have been described in detail, it should be understood that various changes, substitutions and alterations may be made herein without departing from the scope of the invention.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The present invention is limited only as defined in the following claims and equivalents thereof.

What is claimed is:

1. An operational amplifier comprising:
  a differential amplifier for amplifying differential input signals to generate differential amplified signals; and
  first and second single-ended amplifiers that each amplify the differential amplified signals to respectively generate first and second single-ended output signals that are differential with respect to each-other,
  wherein the first single-ended amplifier includes a first transistor and a second transistor having the differential amplified signals applied thereon, and wherein each of the first and second transistors is connected in series with only another respective transistor between a high power source voltage and a low power source voltage,
  and wherein the second single-ended amplifier includes a third transistor and a fourth transistor having the differential amplified signals applied thereon, and wherein each of the third and fourth transistors is connected in series with only another respective transistor between the high power source voltage and the low power source voltage.

2. The operational amplifier of claim 1, wherein the first and second single-ended amplifiers do not have any common mode feed-back bias applied thereon.

3. The operational amplifier of claim 1, wherein the differential amplifier includes:
  first differentially coupled input transistors having the differential input signals applied thereon; and
  a cascode load coupled to the first differentially coupled input transistors for generating the differential amplified signals.

4. The operational amplifier of claim 3, wherein the first differentially coupled input transistors are a pair of NMOSFETs (N-channel metal oxide semiconductor field effect transistors).

5. The operational amplifier of claim 3, wherein the first differentially coupled input transistors are a pair of PMOSFETs (P-channel metal oxide semiconductor field effect transistors).

6. The operational amplifier of claim 3, wherein the differential amplified signals are generated at differential output nodes, and wherein the cascode load includes a respective stack of at least two MOSFETs (metal oxide semiconductor field effect transistors) coupled between each differential output node and a power supply.

7. The operational amplifier of claim 6, wherein the cascode load has a common mode feed-back bias applied thereon.

8. The operational amplifier of claim 3, wherein the first and second single-ended amplifiers have a same circuit topology.

9. The operational amplifier of claim 3, wherein each of the first and second single-ended amplifiers includes:
   second differentially coupled input transistors that are said first and second transistors for the first single-ended amplifier, and that are said third and fourth transistors for the second single-ended amplifier; and
   a current-mirror load comprising a diode-connected transistor coupled to one of the second differentially coupled input transistors, and comprising a non-diode-connected transistor coupled to another of the second differentially coupled input transistors for generating one of the first and second single-ended outputs,
   wherein only one of the second differentially coupled input transistors and the diode-connected transistor is connected in series between the high power source voltage and the low power source voltage,
   and wherein only the other of the second differentially coupled input transistors and the non-diode-connected transistor is connected in series between the high power source voltage and the low power source voltage.

10. The operational amplifier of claim 9, wherein the second differentially coupled input transistors are a pair of NMOSFETs (N-channel metal oxide semiconductor field effect transistors).

11. The operational amplifier of claim 9, wherein the second differentially coupled input transistors are a pair of PMOSFETs (P-channel metal oxide semiconductor field effect transistors).

12. The operational amplifier of claim 1, wherein the differential amplified signals are generated at differential output nodes, and wherein the differential amplifier includes:
   first differentially coupled input transistors having the differential input signals applied thereon;
   a cascode load coupled to the input transistors and coupled between the differential output nodes and a first power supply; and
   an active load comprised of a respective single transistor coupled between each of the differential output nodes and a second power supply.

13. The operational amplifier of claim 12, wherein each of the first and second single-ended amplifiers includes:
   second differentially coupled input transistors that are said first and second transistors for the first single-ended amplifier, and that are said third and fourth transistors for the second single-ended amplifier; and
   a current-mirror load comprising a diode-connected transistor coupled to one of the second differentially coupled input transistors, and comprising a non-diode-connected transistor coupled to another of the second differentially coupled input transistors for generating one of the first and second single-ended outputs,
   wherein only one of the second differentially coupled input transistors and the diode-connected transistor is connected in series between the high power source voltage and the low power source voltage,
   and wherein only the other of the second differentially coupled input transistors and the non-diode-connected transistor is connected in series between the high power source voltage and the low power source voltage.

14. The operational amplifier of claim 1, wherein the differential amplifier includes:
   a pair of differentially coupled PMOSFETs (P-channel metal oxide semiconductor field effect transistors) and a pair of differentially coupled NMOSFETs (N-channel metal oxide semiconductor field effect transistors), wherein one of the PMOSFETs and the NMOSFETs have gates coupled together with one of the differential input signals applied thereon, and wherein another of the PMOSFETs and the NMOSFETs have gates coupled together with another of the differential input signals applied thereon; and
   a cascode load coupled to the PMOSFETs and the NMOSFETs for generating the differential amplified signals.

15. The operational amplifier of claim 14, wherein each of the first and second single-ended amplifiers includes:
   differentially coupled input transistors that are said first and second transistors for the first single-ended amplifier, and that are said third and fourth transistors for the second single-ended amplifier; and
   a current-mirror load comprising a diode-connected transistor coupled to one of the differentially coupled input transistors, and comprising a non-diode-connected transistor coupled to another of the differentially coupled input transistors for generating one of the first and second single-ended outputs,
   wherein only one of the second differentially coupled input transistors and the diode-connected transistor is connected in series between the high power source voltage and the low power source voltage,
   and wherein only the other of the second differentially coupled input transistors and the non-diode-connected transistor is connected in series between the high power source voltage and the low power source voltage.

16. The operational amplifier of claim 1, wherein each of the first and second single-ended amplifiers includes:
   differentially coupled input transistors that are said first and second transistors for the first single-ended amplifier, and that are said third and fourth transistors for the second single-ended amplifier; and
   a current-mirror load comprising a diode-connected transistor coupled to one of the differentially coupled input transistors, and comprising a non-diode-connected transistor coupled to another of the differentially coupled input transistors for generating one of the first and second single-ended outputs,
   wherein only one of the second differentially coupled input transistors and the diode-connected transistor is connected in series between the high power source voltage and the low power source voltage,
   and wherein only the other of the second differentially coupled input transistors and the non-diode-connected transistor is connected in series between the high power source voltage and the low power source voltage.

17. The operational amplifier of claim 16, wherein the differentially coupled input transistors are a pair of NMOSFETs (N-channel metal oxide semiconductor field effect transistors).

18. The operational amplifier of claim 16, wherein the differentially coupled input transistors are a pair of PMOSFETs (P-channel metal oxide semiconductor field effect transistors).

19. An operational amplifier comprising:
   means for amplifying differential input signals to generate differential amplified signals; and
   means for amplifying the differential amplified signals to generate first and second single-ended output signals that are differential with respect to each-other,
   wherein the means for amplifying the differential amplified signals includes first and second single-ended amplifiers, and wherein the first single-ended amplifier includes a first transistor and a second transistor having the differential amplified signals applied thereon, and wherein each of the first and second transistors is connected in series with only another respective transistor between a high power source voltage and a low power source voltage, and wherein the second single-ended amplifier includes a third transistor and a fourth transistor having the differential amplified signals applied thereon, and wherein each of the third and fourth transistors is connected in series with only another respective transistor between the high power source voltage and the low power source voltage.

20. The operational amplifier of claim 19, wherein any common mode feed-back bias is not used in the means for amplifying the differential amplified signals to generate the first and second single-ended output signals.

* * * * *